United States Patent
Harvey (10) Patent No.: US 6,448,853 B1
(45) Date of Patent: Sep. 10, 2002

(54) DISTORTION IMPROVEMENT IN AMPLIFIERS

(75) Inventor: Barry Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/829,326

(22) Filed: Apr. 9, 2001

(51) Int. Cl.[7] .................................................. H03F 3/45
(52) U.S. Cl. ........................ 330/252; 330/257; 330/292
(58) Field of Search .............................. 330/252, 257, 330/292

(56) References Cited

U.S. PATENT DOCUMENTS

| | | | |
|---|---|---|---|
| 4,462,002 A | * | 7/1984 | Schade, Jr. ................. 330/253 |
| 4,713,628 A | * | 12/1987 | Nelson ........................ 330/254 |
| 4,881,043 A | * | 11/1989 | Jason ........................... 330/252 |
| 5,990,748 A | * | 11/1999 | Tomasini et al. ........... 330/292 |

* cited by examiner

Primary Examiner—Robert Pascal
Assistant Examiner—Henry Choe
(74) Attorney, Agent, or Firm—Fliesler, Dubb, Meyer & Lovejoy, LLP (57) ABSTRACT

An improved amplifier includes an input stage differential amplifier (100) with an output forming a gain node (102), an output stage buffer (104) having an input connected to the gain node (102), a compensation capacitor (106) connected from the gain node (102) to ground, and a correction amplifier (200) with a first input connected to the output of the output stage buffer (104), a second input connected to the input of the output stage buffer (104), and having an output connected to the gain node (102), the correction amplifier further including a correction capacitor (304) connected between the input and output of the output stage buffer (104). The correction capacitor (304) preferably has a capacitance value (C') set equal to the capacitance (Ccomp) of the compensation capacitor (106).

9 Claims, 7 Drawing Sheets

DISTORTION IMPROVEMENT IN AMPLIFIERS

BACKGROUND OF THE INVENTION

1. Field of the Invention

The present invention relates to circuitry for controlling distortion due to current variations in output stage driver transistors of an amplifier.

2. Background

Several factors can produce distortion in amplifiers. One of many is the output stage. Because the output stage must provide widely varying output load currents but only draw modest quiescent currents, the output and driver transistors undergo decades of current variation throughout the output drive range. The decades of current variation causes the output and driver transistor $V_{BE}$S to change according to logarithmic law, causing distortion when superimposed on linear signals.

Figure 1:
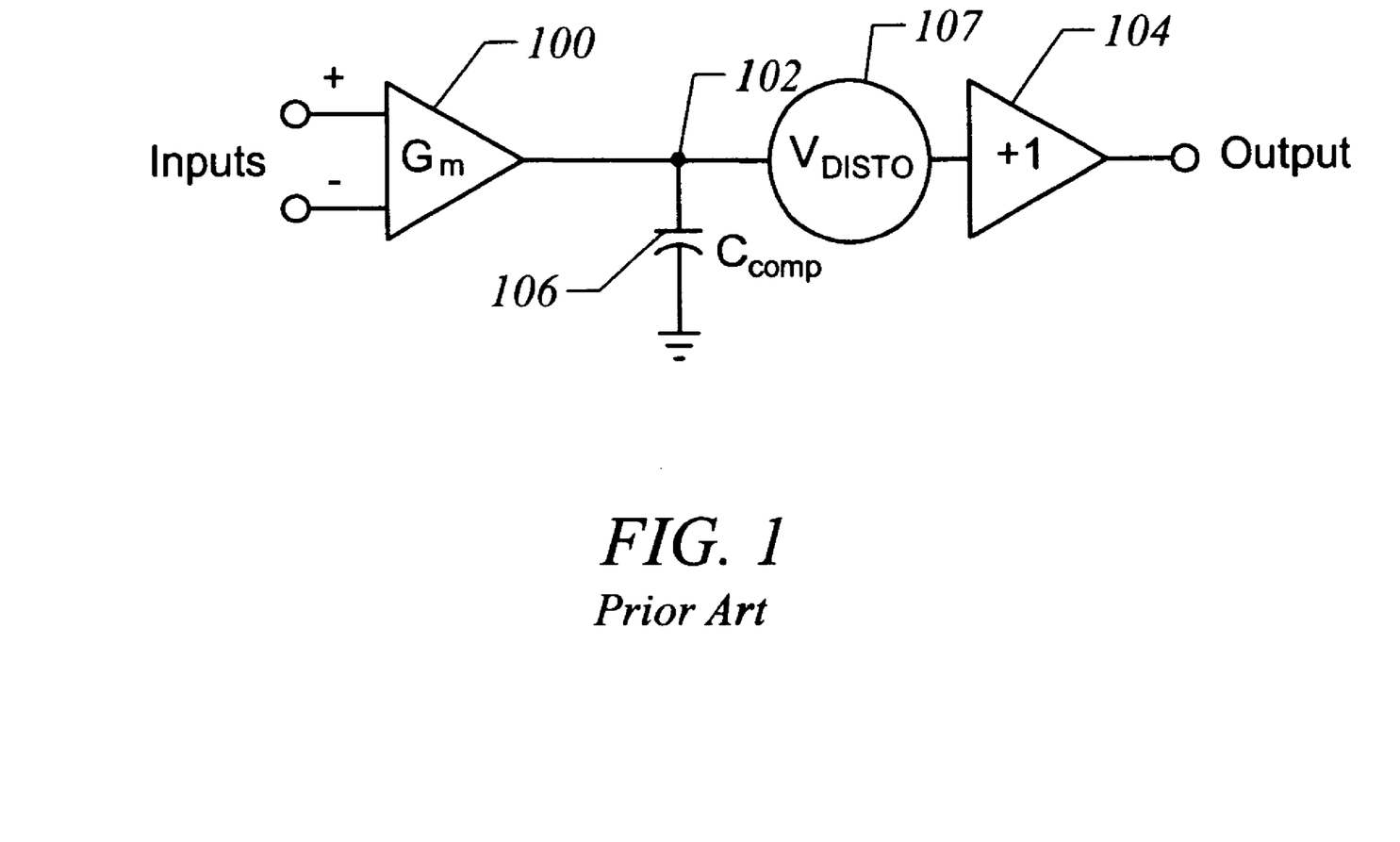
FIG. 1 shows a block diagram of a typical amplifier.

A typical amplifier block diagram is shown in FIG. 1. In the amplifier of FIG. 1, an input differential voltage is applied across input stage amplifier 100 to drive a gain node 102. The gain node 102 is buffered by an output stage buffer 104 forming an output buffer for the overall amplifier of FIG. 1. The output buffer 104 has a nominal gain of +1. The frequency response is set by setting the capacitance Ccomp of capacitor 106.

Distortion created by the output buffer 104 can be modeled as a voltage source $V_{DISTO}$ 107 in series with the input of the output buffer 104. To correct for $V_{DISTO}$, some type of feedback is typically employed to adjust the differential input voltage.

Figure 2:
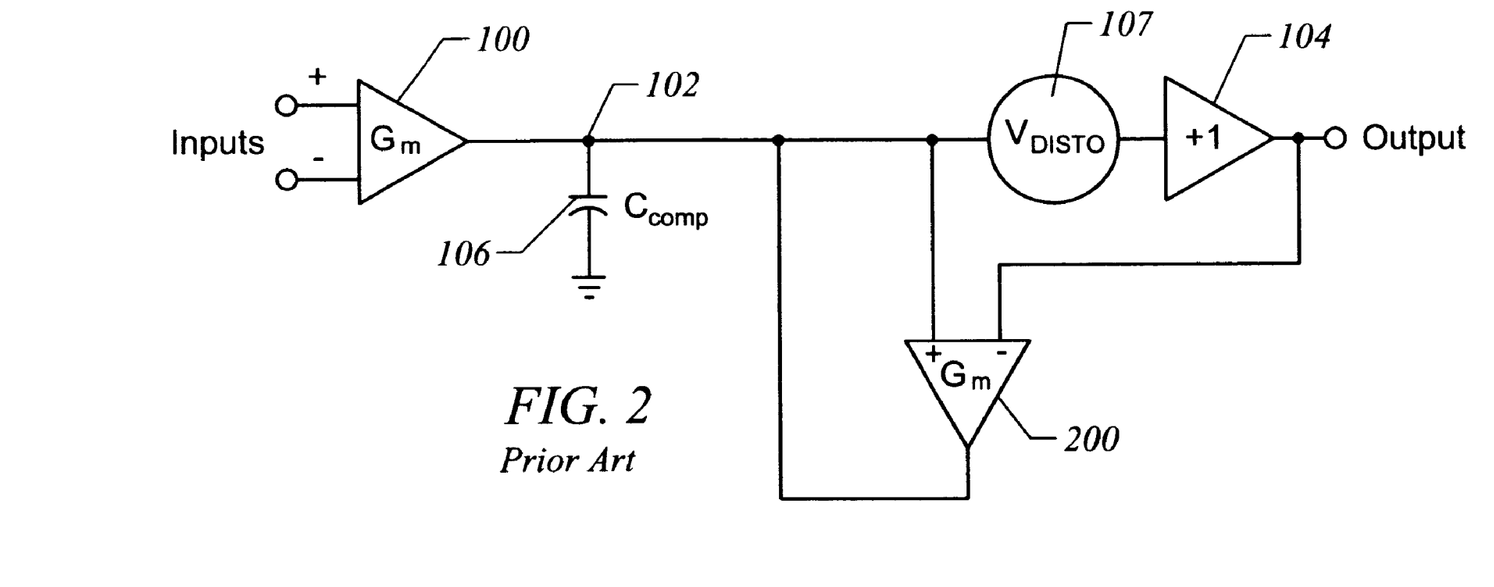
FIG. 2 shows a block diagram illustrating modifications to the amplifier circuit of FIG. 1 to correct the distortion modeled as $V_{DISTO}$.

FIG. 2 shows a block diagram of an amplifier with circuitry including correction amplifier 200 to correct for $V_{DISTO}$ by creating an error current which is injected into the gain node 102. The gain of the correction amplifier 200, Gm', allows the error from the gain node to the final output to be observed. The gain of the amplifier 200 is typically set using an internal resistor. Previous designs employed the resistor with a value set so that the magnitude of Gm' was less than the input differential Gm for stability. The Gm' values of previous designs were also generally flat with frequency due to the resistor R controlling Gm'. Note that components carried over from FIG. 1 to FIG. 2 are similarly labeled, as will be components carried over in subsequent figures.

SUMMARY OF THE INVENTION

In accordance with the present invention an improved amplifier is provided with circuitry to correct for $V_{DISTO}$ by creating an error current from a correction amplifier which is injected into the gain node, similar to FIG. 2. The circuit in accordance with the present invention includes components as in FIG. 2, with the correction amplifier including a correction capacitor to correct for $V_{DISTO}$. Unlike typical circuits which included a resistor, with the correction capacitor the effective correction value will not be flat with frequency. The correction capacitor has a capacitance value C' preferably set equal to the capacitance of the compensation capacitor Ccomp. With the value for C' so set, Gm'=sComp and the feedback current provided will be exactly the amount the differential input to amplifier 100 would have to be adjusted in feedback to supply the correct current to compensate for $V_{DISTO}$. Thus, no input differential voltage is needed to cancel $V_{DISTO}$, and the distortion is effectively cancelled. Another benefit of using the correction capacitor is that output impedance is reduced over frequency.

BRIEF DESCRIPTION OF THE DRAWINGS

The present invention will be described with respect to particular embodiments thereof, and references will be made to the drawings in which.

DETAILED DESCRIPTION

Figure 3:
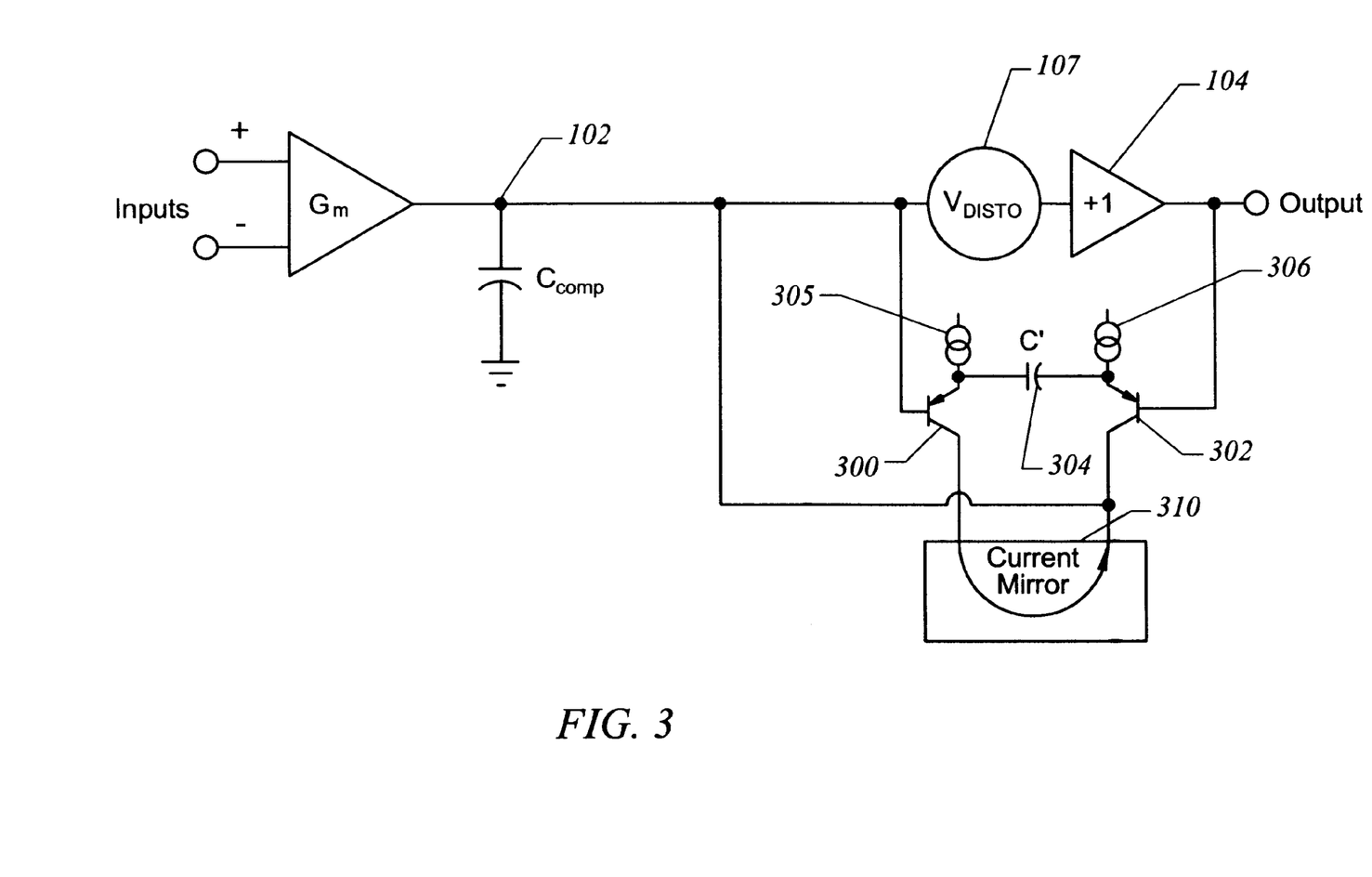
FIG. 3 shows circuitry in accordance with the present invention with components implementing the block diagram of FIG. 2, but with a correction capacitor used to set Gm'.

One realization of circuitry for the block diagram shown in FIG. 2 where Gm' can be controlled to be approximately equal to sComp is shown in block diagram FIG. 3. In FIG. 3, the two PNP transistors 300 and 302 form a differential amplifier with a Gm' of sC', where C' is the capacitance of capacitor 304. A current mirror 310 is used to convert the differential output from the collectors of transistors 300 and 302 to a single-ended output to apply to the gain node 102. The emitters of transistors 300 and 302 are fed by respective current sources 305 and 306.

Figure 4:
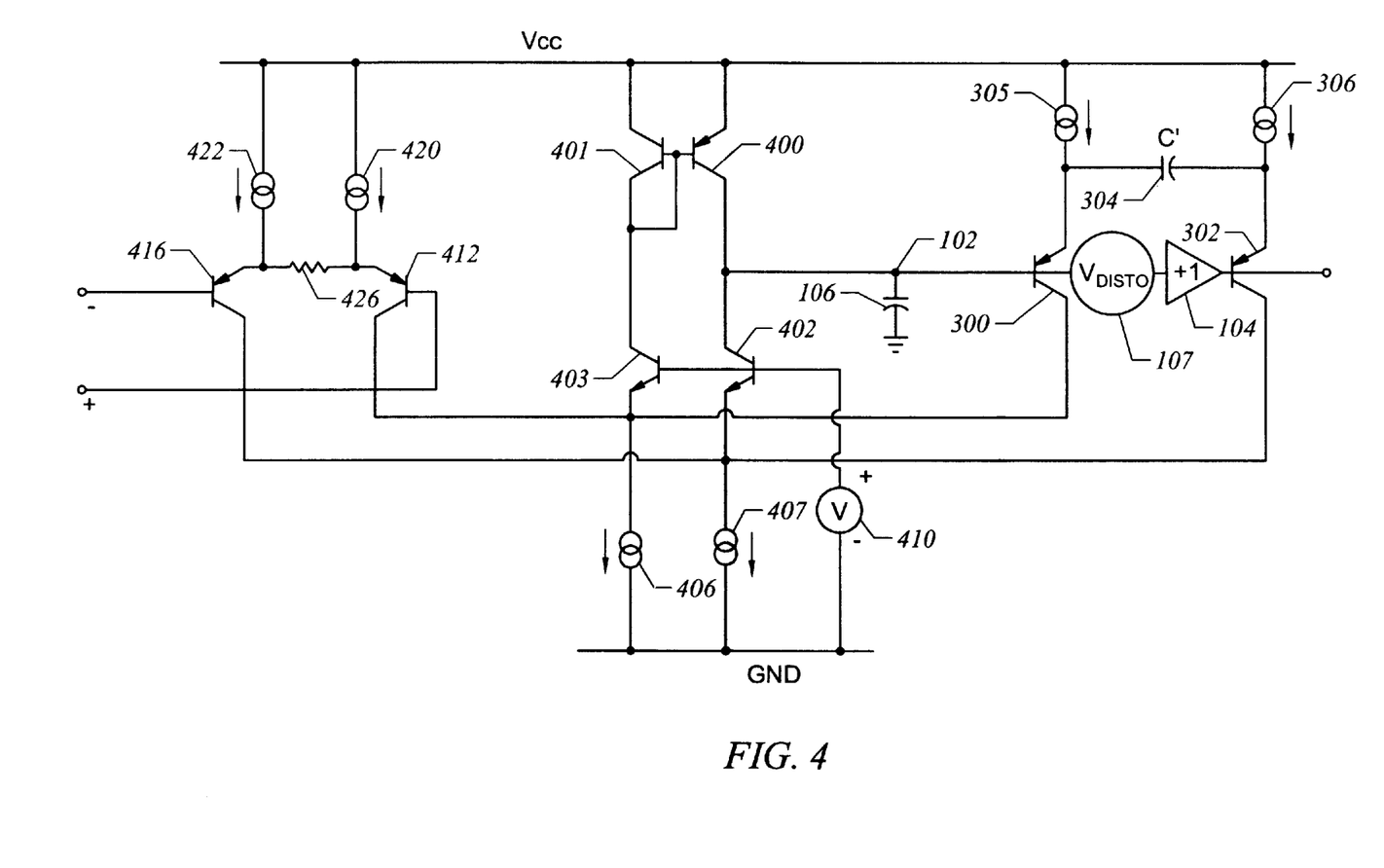
FIG. 4 shows details of components for implementation of the circuit of FIG. 3.

Details of components which may be used for the block diagram of FIG. 3 are shown in FIG. 4. In FIG. 4, the circuitry for the current mirror 310 of FIG. 3 includes transistors 400–403, current sinks 406 and 407 and a voltage source 410. The transistors 400 and 401 are connected in a current mirror configuration with bases connected together and the collector of transistor 401 connected to its base. The gain node 102 is connected at the collector of transistor 400. Emitters of transistors 400 and 401 are connected from the power supply pin connection shown as Vcc. Cascode transistor 403 connects the collector of transistor 401 to a current sink 406, while cascade transistor 404 connects the collector of transistor 400 to current sink 407. A cascode transistor indicates the transistor is configured to vary the current at its collector by changing the emitter current, as opposed to controlling collector current by varying base voltage in a more standard biasing scheme. The current sinks 406 and 407 sink current to a power supply pin connection shown connected to ground (GND). A voltage supply 410 is connected to the bases of transistors 402 and 403. The collector of differential stage transistor 300 is connected to the emitter of transistor 403, while the collector of transistor 302 is connected to the emitter of transistor 402.

In FIG. 4, the circuitry for the amplifier 100 of FIG. 3 includes differential transistors 412 and 416, current sinks 420 and 422 and resistor 426. The noninverting amplifier input (+) is connected to the base of transistor 412, while the inverting amplifier input (−) is connected to the base of transistor 416. Current is provided from current sink 420 from Vcc to the emitter of transistor 412, while current is provided from current sink 422 to the emitter of transistor 416. The emitters of transistors 412 and 416 are further connected together by resistor 426. The collector of transistor 412 is connected to the collector of transistor 300, while the collector of transistor 416 is connected to the collector of transistor 302.

Figure 5:
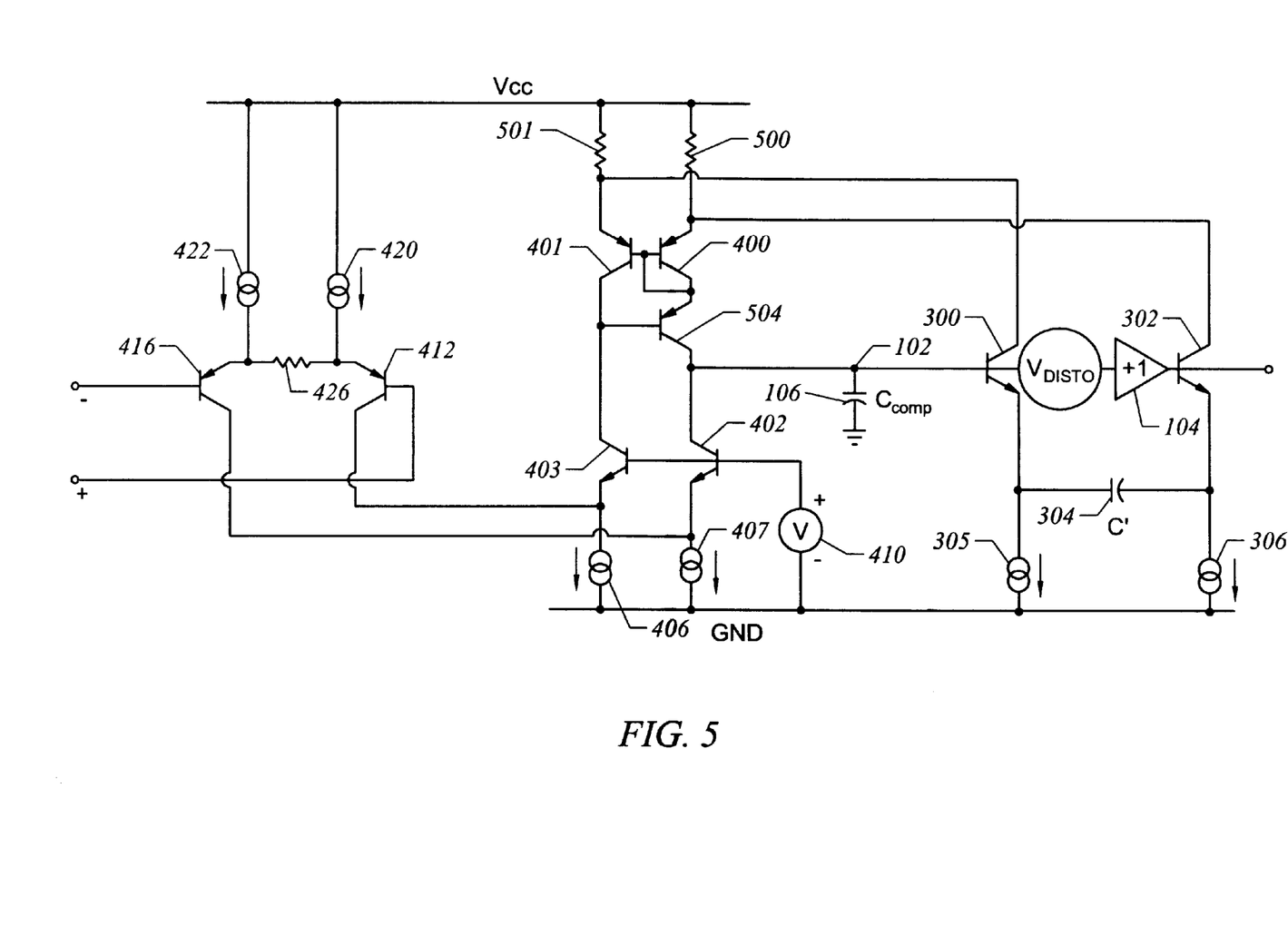
FIG. 5 shows yet another embodiment of components for implementation of the circuit of FIG. 3.

FIG. 5 shows another embodiment of detailed components which may be used for the circuit of FIG. 3. The circuit of FIG. 5 varies from FIG. 4 first by configuring current sinks 305 and 306 to sink current from the emitters of respective transistors 300 and 302 to GND, as opposed to sourcing current from Vcc to the emitters of transistors 305 and 306. The collectors of transistors 300 and 302 are rearranged from the connection in FIG. 4 to be connected to the emitters of respective transistors 401 and 400. The bases of transistors 400 and 401 are connected together to the collector of transistor 400. The emitters of transistors 400 and 401 are separated from Vcc by respective resistors 500 and 501. A transistor 504 is further added to separate the collector of transistor 400 from transistor 402. The base of transistor 504 is connected to the collector of transistor 401. The gain node 102 is connected to the common collectors of transistors 504 and 402. The transistor 504 serves to limit the effect of variations in Vcc on the output of the amplifier. The remaining components are connected as in FIG. 5.

In the circuitry of FIG. 3, FIG. 4, or FIG. 5, a resistor is preferably placed in series with C' 304. The value of the resistor in series with capacitor C' should be greater than 1/Gm to ensure high-frequency stability by limiting the maximum amount of positive feedback through the capacitor 304 providing C' that Gm must overcome.

The circuits in FIGS. 3–5 use a differential amplifier stage formed using transistors 300 and 302 connected to capacitor 304. Another circuit is shown in FIG. 6 which realizes the block diagram of FIG. 2 without a differential stage connected to a capacitor 304 providing C'.

Figure 6:
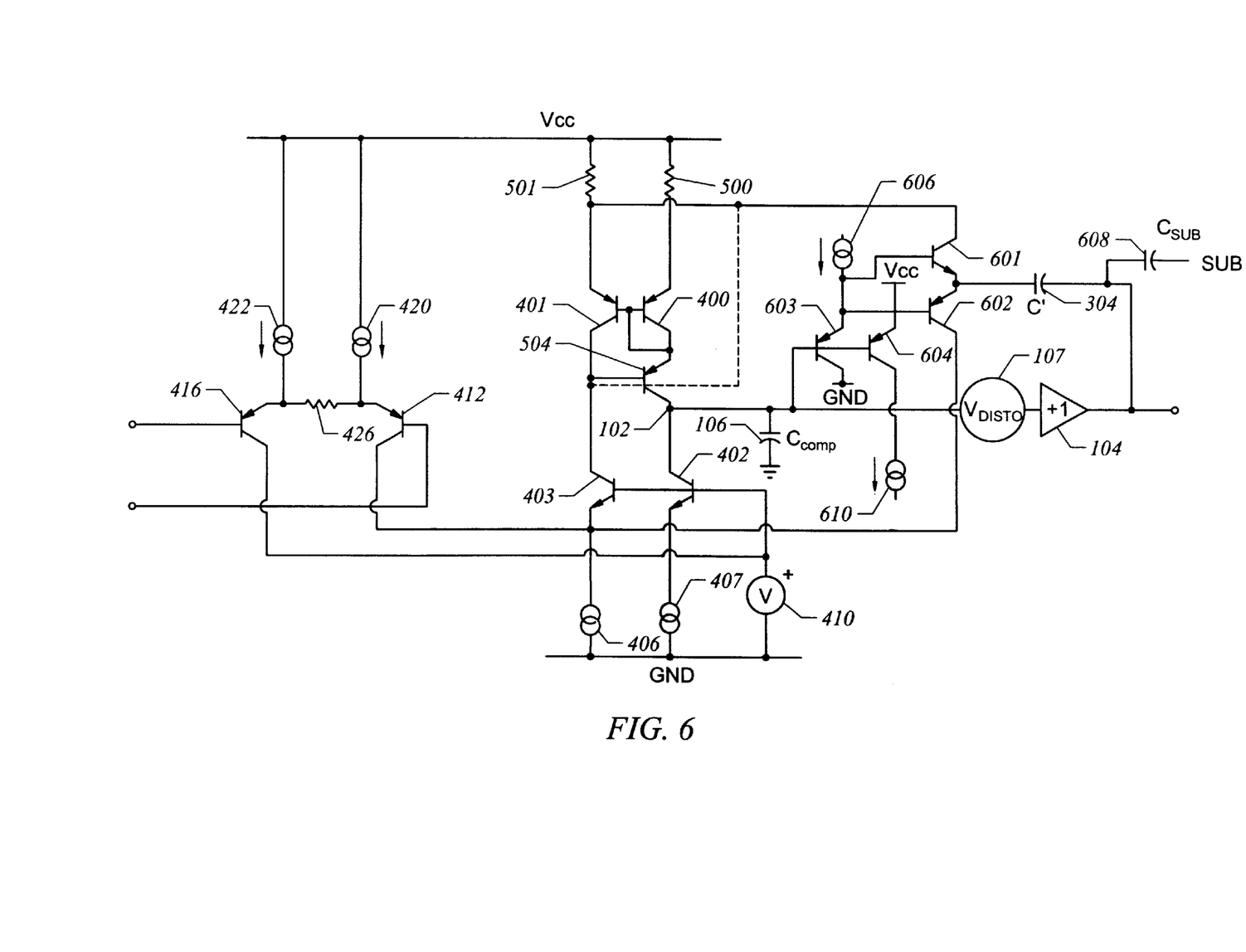
FIG. 6 shows an embodiment to implement the block diagram of FIG. 3 with amplification provided without a differential stage connected to the correction capacitor.

In the circuit of FIG. 6, transistors 601–604 replicate the voltage at the gain node 102, so capacitor 304 providing C' has a voltage Vgain of the gain node 102 on one terminal of the emitters of transistors 601 and 602, and Vgain-$V_{DISTO}$ at its other terminal (output). A current $sV_{DISTO}C'$ is developed by capacitor 304 at the emitters of transistors 601 and 602 and routed through transistors 601 and 602. These currents rejoin at the gain node 102 to cancel $V_{DISTO}$ via the upper current mirror transistors 400–401 and the lower cascode transistors 402 and 403.

The circuit of FIG. 6 modifies FIG. 5 by adding the new transistors 603 and 604 both having a base connected to the gain node 102. The emitter of transistor 603 is driven by a current source 606, while its collector is connected to GND. The emitter of transistor 604 is connected to a current sink 610, while is collector is connected directly to Vcc. The base of newly added transistor 601 is connected to the emitter of transistor 603, while the base of new transistor 602 is connected to the emitter of transistor 604. The collector of transistor 602 is connected to the emitter of transistor 403. The collector of transistor 601 is connected to the emitter of transistor 401. Alternatively, the collector of transistor 601 can be connected to the collector of transistor 401 as shown by the dashed lines. The remaining components of FIG. 6 which form the input amplifier and current mirror have components connected as in FIG. 5.

An advantage of the circuit of FIG. 6 is that the substrate capacitance 608 connected to the terminal of capacitor 304 at the output of the amplifier can be driven by the output and its current not upset the correct $SC'V_{VISTO}$ current. A disadvantage is that the collector currents of transistors 601 and 602 upset the DC balance of the cascode transistors 402–403 and current-mirror transistors 400–401.

Figure 7:
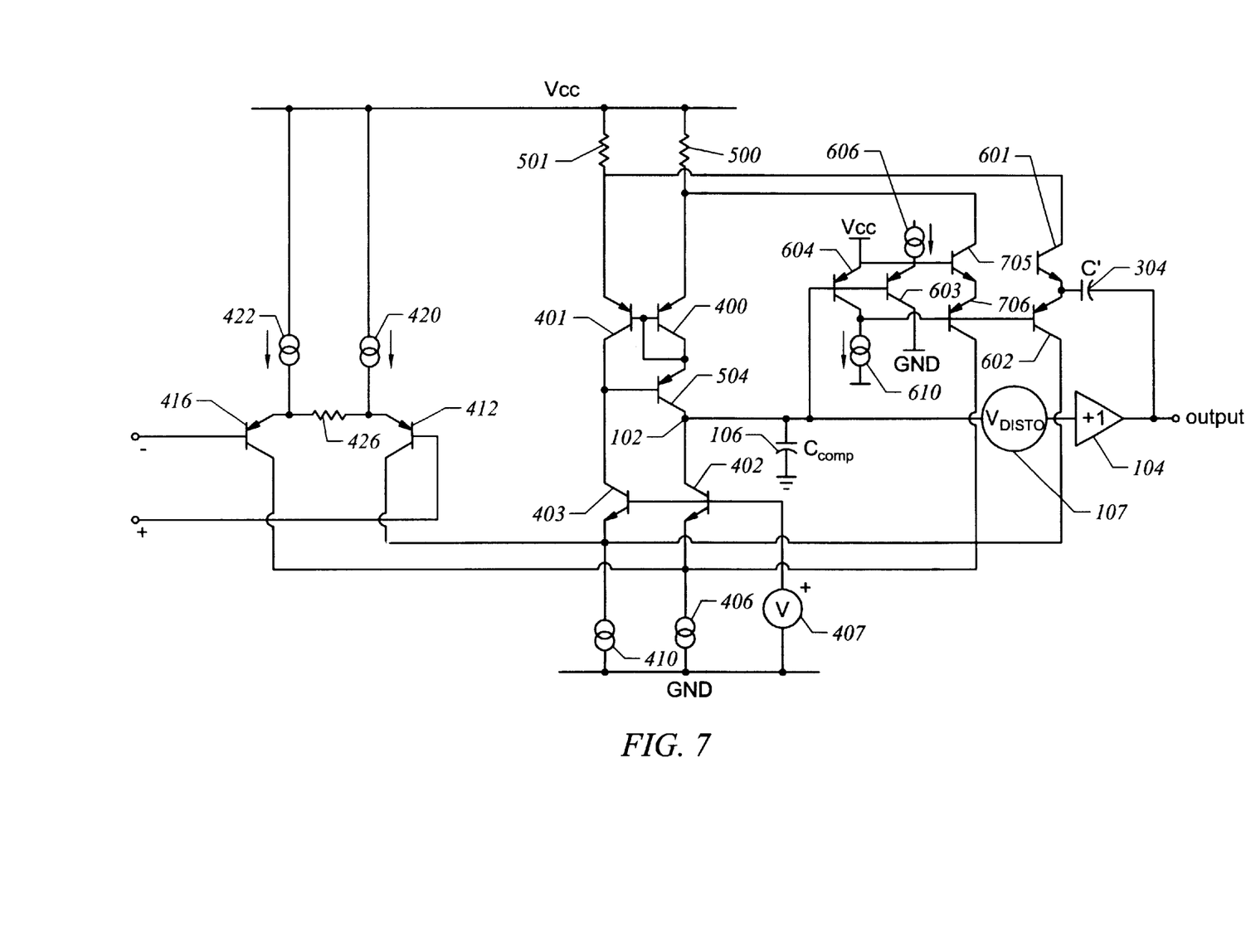
FIG. 7 shows circuitry added to FIG. 6 to improve overall performance.

The circuit of FIG. 7 corrects for the problems with DC balance from the circuit of FIG. 6. In FIG. 7, transistors 705 and 706 provide DC currents equal to transistors 601 and 602 so as to not upset the balance of associated circuitry. No C' correction current flows through transistors 705 and 706, and the effects of CjC of transistors 601 and 602 is cancelled by the transistors 705 and 706 connections, assuming the transistor sizes are the same respectively.

The circuit of FIG. 7 includes the components of FIG. 6, with newly added transistors 705 and 706. Similar to transistors 601 and 602, transistors 705 and 706 have common emitters. The base of transistor 705 is connected with the base of transistor 601 to the emitter of transistor 603, while the base of transistor 706 is connected with the base of transistor 602 to the emitter of transistor 604. The collector of transistor 705 is connected to the emitter of transistor 400. The collector of transistor 706 is connected to the emitter of transistor 402.

Although transistors are shown as one preferable type, such as transistors 400 and 401 which are PNP and transistors 402 and 403 which are NPN, transistor types may be as interchanged and the invention still function for its intended purpose. Further, although the pin connections are labeled as Vcc and GND, various voltage potentials could be applied to these power supply rails, such as +5 volts to Vcc and −5 volts to GND, or +5 volts to Vcc and 0 volts to ground.

Although the present invention has been described above with particularity, this was merely to teach one of ordinary skill in the art how to make and use the invention. Many other modifications will fall within the scope of the invention, as that scope is defined by the claims provided below.

What is claimed is:

1. An amplifier comprising:
   an input differential amplifier (100) having a first input providing an inverting input (−) to the amplifier, and a second input providing a noninverting input (+) to the amplifier, and having an output forming a gain node;
   a compensation capacitor (106) having a first terminal coupled to the gain node and having an output coupled to a first power supply terminal;
   an output buffer amplifier (104) having an input coupled to the gain node and an output forming the output of the amplifier; and
   a correction amplifier (200) having a first input coupled to the output of the output buffer amplifier, a second input coupled to the gain node, and an output coupled to the gain node, wherein the correction amplifier comprises:
      a correction capacitor (304) having a first terminal coupled to the output of the output buffer amplifier, and a second terminal coupled to the gain node.

2. The amplifier of claim 1, wherein the correction capacitor (304) has a capacitance value set to be proportional to a capacitance value of the compensation capacitor.

3. The amplifier of claim 2, wherein the correction capacitor (304) has a capacitance value set equal to a capacitance value of the compensation capacitor.

4. The amplifier of claim 1, wherein the correction amplifier comprises:
   a differential amplifier comprising:
      a first current sink (306);
      a second current sink (305);
      a first transistor (302) having a base coupled to the output of the output buffer amplifier, an emitter coupled to the first terminal of the correction capacitor (304) and to the first current sink (306), and a collector coupled to the gain node;

a second transistor (300) having a base coupled to the gain node, an emitter coupled to the second terminal of the correction capacitor (304) and to the second current sink (305), and a collector; and a current mirror (310) having an input coupled to the collector of the second transistor and an output coupled to the collector of the first transistor.

5. The amplifier of claim 1,
wherein the input differential amplifier comprises:
   a first current sink (422);
   a second current sink (420);
   a first transistor (416) having a base forming the inverting input (−) of the amplifier, an emitter coupled to the first current sink (422), and a collector;
   a second transistor (412) having a base forming the noninverting input (+) of the amplifier, an emitter coupled to the second current sink (420), and a collector; and
   a resistor (426) coupled from the emitter of the first transistor (416) to the emitter of the second transistor (412); and
wherein the correction amplifier comprises:
   a differential amplifier comprising:
      a third current sink (306);
      a fourth current sink (305);
      a third transistor (302) having a base coupled to the output of the output buffer amplifier, an emitter coupled to the first terminal of the correction capacitor (304) and to the third current sink (306), and a collector coupled to the collector of the first transistor (416);
      a fourth transistor (300) having a base coupled to the gain node (102), an emitter coupled to the second terminal of the correction capacitor (304) and the fourth current sink (305), and a collector coupled to the collector of the second transistor (412);
   a current mirror comprising:
      a fifth transistor (400) having an emitter coupled to a first power supply terminal (Vcc), a collector coupled to the gain node (102), and a base;
      a sixth transistor (401) having an emitter coupled to the first power supply terminal (Vcc), a base coupled to the base of the fifth transistor (400), and a collector coupled to the base of the sixth transistor (401);
   a fifth current sink (407);
   a sixth current sink (406);
   a voltage source (410);
   a first cascode transistor (402) having a base coupled to the voltage source (410), an emitter coupled to the collector of the third transistor (302) and the sixth current sink (406), and having a collector coupled to the gain node (102); and
   a second cascode transistor (403) having a base coupled to the voltage source (410), an emitter coupled to the collector of the fourth transistor (300) and the fifth current sink (407), and having a collector coupled to the collector of the sixth transistor (401).

6. The amplifier of claim 1,
wherein the input differential amplifier comprises:
   a first current sink (422);
   a second current sink (420);
   a first transistor (416) having a base forming the inverting input (−) of the amplifier, an emitter coupled to the first current sink (422), and a collector;
   a second transistor (412) having a base forming the noninverting input (+) of the amplifier, an emitter coupled to the second current sink (420), and a collector; and
   a resistor (426) coupled from the emitter of the first transistor (416) to the emitter of the second transistor (412); and
wherein the correction amplifier comprises:
   a differential amplifier comprising:
      a third current sink (306);
      a fourth current sink (305);
      a third transistor (302) having a base coupled to the output of the output buffer amplifier (104), an emitter coupled to the third current sink (306), and having a collector;
      a fourth transistor (300) having a base coupled to the gain node (102), an emitter coupled to the fourth current sink (305), and having a collector;
   a current mirror comprising:
      a fifth transistor (400) having an emitter coupled to the collector of the third transistor (302) and through a first resistor (500) to a first power supply terminal (Vcc), and having a collector and base coupled together;
      a sixth transistor (401) having an emitter coupled to the collector of the fourth transistor (300) and through a second resistor (501) to the first power supply terminal (Vcc), a base coupled to the base of the fifth transistor (400), and having a collector;
      a seventh transistor (504) having an emitter coupled to the collector of the fifth transistor (400), a base coupled to the collector of the sixth transistor (401), and having a collector coupled to the gain node (102);
   a fifth current sink (406);
   a sixth current sink (407);
   a voltage source (410);
   a first cascode transistor (402) having a base coupled to the voltage source {410), an emitter coupled to the collector of the first transistor (416) and the sixth current sink (407), and having a collector coupled to the gain node(102); and
   a second cascode transistor (403) having a base coupled to the voltage source (410), an emitter coupled to the collector of the second transistor (412) and the fifth current sink (406), and having a collector coupled to the collector of the seventh transistor (401).

7. The amplifier of claim 1,
wherein the input differential amplifier comprises:
   a first current sink (422);
   a second current sink (420);
   a first transistor (416) having a base forming the inverting input (−) of the amplifier, an emitter coupled to the first current sink (422), and a collector;
   a second transistor (412) having a base forming the noninverting input (+) of the amplifier, an emitter coupled to the second current sink (420), and a collector; and
   a resistor (426) coupled from the emitter of the first transistor (416) to the emitter of the second transistor (412); and
wherein the correction amplifier comprises:
   a third current sink (606);
   a fourth current sink (610);
   a third transistor (603) having a base coupled to the gain node (102), an emitter coupled to the third current sink (606), and having a collector coupled to a first voltage supply (GND);

a fourth transistor (604) having a base coupled to the gain node (102), an emitter coupled to the fourth current sink (610), and having a collector coupled to the first voltage supply (GND);

a fifth transistor (601) having a base coupled to the emitter of the third transistor (603), an emitter coupled to the second terminal of the correction capacitor (304), and having a collector; and a sixth transistor (602) having a base coupled to the emitter of the fourth transistor (604), an emitter coupled to the second terminal of the correction capacitor (304), and having a collector coupled to the collector of the second transistor (412);

a current mirror comprising:
  a seventh transistor (400) having a collector and base coupled together, an emitter connected through a first resistor (500) to a second power supply terminal (Vcc);
  a eighth transistor (401) having an emitter connected through a second resistor (501) to the second power supply terminal (Vcc), a base coupled to the base of the seventh transistor (400), and having a collector coupled to the collector of the fifth transistor (601);
  a ninth transistor (504) having an emitter coupled to the collector of the seventh transistor (400), a base coupled to the collector of the eighth transistor (401), and having a collector coupled to the gain node (102);

a fifth current sink (406);
a sixth current sink (407);
a voltage source (410);
a first cascode transistor (402) having a base coupled to the voltage source {410), an emitter coupled to the collector of the first transistor (416) and the sixth current sink (407), and having a collector coupled to the gain node(102); and
a second cascode transistor (403) having a base coupled to the voltage source (410), an emitter coupled to the collector of the second transistor (412) and the fifth current sink (406), and having a collector coupled to the collector of the seventh transistor (401).

8. The amplifier of claim 1,
wherein the input differential amplifier comprises:
  a first current sink (422);
  a second current sink (420);
  a first transistor (416) having a base forming the inverting input (−) of the amplifier, an emitter coupled to the first current sink (422), and a collector;
  a second transistor (412) having a base forming the noninverting input (+) of the amplifier, an emitter coupled to the second current sink (420), and a collector; and
  a resistor (426) coupled from the emitter of the first transistor (416) to the emitter of the second transistor (412); and
wherein the correction amplifier comprises:
  a third current sink (606);
  a fourth current sink (610);
  a third transistor (603) having a base coupled to the gain node (102), an emitter coupled to the third current sink (606), and having a collector coupled to a first voltage supply (GND);
  a fourth transistor (604) having a base coupled to the gain node (102), an emitter coupled to the fourth current sink (610), and having a collector coupled to the first voltage supply (GND);
  a fifth transistor (601) having a base coupled to the emitter of the third transistor (603), an emitter coupled to the second terminal of the correction capacitor (304), and having a collector; and
  a sixth transistor (602) having a base coupled to the emitter of the fourth transistor (604), an emitter coupled to the second terminal of the correction capacitor (304), and having a collector coupled to the collector of the second transistor (412);

a current mirror comprising:
  a seventh transistor (400) having a collector and base coupled together, an emitter connected through a first resistor (500) to a second power supply terminal (Vcc);
  a eighth transistor (401) having an emitter connected to the collector of the fifth transistor (601) and through a second resistor (501) to the second power supply terminal (Vcc), a base coupled to the base of the seventh transistor (400), and having a collector;
  a ninth transistor (504) having an emitter coupled to the collector of the seventh transistor (400), a base coupled to the collector of the eighth transistor (401), and having a collector coupled to the gain node (102);

a fifth current sink (406);
a sixth current sink (407);
a voltage source (410);
a first cascode transistor (402) having a base coupled to the voltage source {410), an emitter coupled to the collector of the first transistor (416) and the sixth current sink (407), and having a collector coupled to the gain node(102); and
a second cascode transistor (403) having a base coupled to the voltage source (410), an emitter coupled to the collector of the second transistor (412) and the fifth current sink (406), and having a collector coupled to the collector of the seventh transistor (401).

9. The amplifier of claim 1,
wherein the input differential amplifier comprises:
  a first current sink (422);
  a second current sink (420);
  a first transistor (416) having a base forming the inverting input (−) of the amplifier, an emitter coupled to the first current sink (422), and a collector;
  a second transistor (412) having a base forming the noninverting input (+) of the amplifier, an emitter coupled to the second current sink (420), and a collector; and
  a resistor (426) coupled from the emitter of the first transistor (416) to the emitter of the second transistor (412); and
wherein the correction amplifier comprises:
  a third current sink (606);
  a fourth current sink (610);
  a third transistor (603) having a base coupled to the gain node (102), an emitter coupled to the third current sink (606), and having a collector coupled to a first voltage supply (GND);
  a fourth transistor (604) having a base coupled to the gain node (102), an emitter coupled to the fourth current sink (610), and having a collector coupled to the first voltage supply (GND);
  a fifth transistor (601) having a base coupled to the emitter of the third transistor (603), an emitter coupled to the second terminal of the correction capacitor (304), and having a collector;

a sixth transistor (602) having a base coupled to the emitter of the fourth transistor (604), an emitter coupled to the second terminal of the correction capacitor (304), and having a collector coupled to the collector of the second transistor (412);

a seventh transistor (705) having a base coupled to the emitter of the third transistor (603), a collector and an emitter;

an eighth transistor (706) having a base coupled to the emitter of the fourth transistor (604), an emitter coupled to the emitter of the seventh transistor (705), and having a collector coupled to the collector of the first transistor (416);

a current mirror comprising:

a seventh transistor (400) having a collector and base coupled together, an emitter connected to the emitter of the seventh transistor (705) and connected through a first resistor (500) to a second power supply terminal (Vcc);

a eighth transistor (401) having an emitter connected to the collector of the fifth transistor (601) and through a second resistor (501) to the second power supply terminal (Vcc), a base coupled to the base of the seventh transistor (400), and having a collector;

a ninth transistor (504) having an emitter coupled to the collector of the seventh transistor (400), a base coupled to the collector of the eighth transistor (401), and having a collector coupled to the gain node (102);

a fifth current sink (406);

a sixth current sink (407);

a voltage source (410);

a first cascode transistor (402) having a base coupled to the voltage source {410), an emitter connected to the collector of the first transistor (416) and the sixth current sink (407), and having a collector coupled to the gain node (102); and a second cascode transistor (403) having a base coupled to the voltage source (410), an emitter coupled to the collector of the second transistor (412) and the fifth current sink (406), and having a collector coupled to the collector of the seventh transistor (401).

* * * * *